United States Patent
Lim et al.

(10) Patent No.: US 11,744,135 B2
(45) Date of Patent: Aug. 29, 2023

(54) DISPLAY DEVICE INCLUDING AN OPTICAL PATTERN LAYER

(71) Applicant: SAMSUNG DISPLAY CO., LTD., Yongin-si (KR)

(72) Inventors: Jae Ik Lim, Yongin-si (KR); Dae Young Lee, Yongin-si (KR); Chaun Gi Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 317 days.

(21) Appl. No.: 17/108,557

(22) Filed: Dec. 1, 2020

(65) Prior Publication Data

US 2021/0167144 A1    Jun. 3, 2021

(30) Foreign Application Priority Data

Dec. 3, 2019 (KR) .................. 10-2019-0159161

(51) Int. Cl.
| | |
|---|---|
| *H10K 59/65* | (2023.01) |
| *H10K 50/86* | (2023.01) |
| *H10K 59/122* | (2023.01) |
| *G06V 40/12* | (2022.01) |
| *G06V 40/13* | (2022.01) |
| *H10K 59/38* | (2023.01) |
| *H10K 59/40* | (2023.01) |

(52) U.S. Cl.
CPC ........... *H10K 59/65* (2023.02); *H10K 50/865* (2023.02); *H10K 59/122* (2023.02); *G06V 40/13* (2022.01); *G06V 40/1365* (2022.01); *H10K 59/38* (2023.02); *H10K 59/40* (2023.02)

(58) Field of Classification Search
CPC combination set(s) only.
See application file for complete search history.

(56) References Cited

U.S. PATENT DOCUMENTS

| 8,426,860 B2 | 4/2013 | Sato |
| 9,891,746 B2 | 2/2018 | Bae et al. |
| 2018/0089491 A1 | 3/2018 | Kim et al. |

(Continued)

FOREIGN PATENT DOCUMENTS

| KR | 10-2015-0131944 | 11/2015 |
| KR | 10-2018-0034750 | 4/2018 |
| KR | 10-2019-0092661 | 8/2019 |

OTHER PUBLICATIONS

P. Malinowski et al., "Organic photolithography for displays with integrated fingerprint scanner", Jun. 2019, SID Symposium Digest of Technical Papers 50(1), pp. 1007-1010.

*Primary Examiner* — Nduka E Ojeh
(74) *Attorney, Agent, or Firm* — F. Chau & Associates, LLC

(57) ABSTRACT

A display device includes: a substrate; a first display pixel disposed on the substrate and including a light emitting element; a first sensor pixel disposed on the substrate and including an optical sensor; a first bank disposed on the substrate, wherein the first display pixel is disposed in the first bank; a first light blocking layer overlapping the first bank; a first color filter disposed on the first light blocking layer and overlapping the light emitting element; and an optical pattern layer disposed on the optical sensor, wherein the optical pattern layer includes a light blocking portion and a plurality of light transmitting portions passing through the light blocking portion.

19 Claims, 11 Drawing Sheets

(56) References Cited

U.S. PATENT DOCUMENTS

| | | | |
|---|---|---|---|
| 2018/0308903 A1* | 10/2018 | Jeong | H01L 27/3276 |
| 2018/0373915 A1* | 12/2018 | Ling | H01L 27/3227 |
| 2019/0237521 A1 | 8/2019 | Ju | |
| 2021/0042493 A1* | 2/2021 | Lius | G09G 3/3208 |
| 2021/0366990 A1* | 11/2021 | Tang | H10K 65/00 |

* cited by examiner

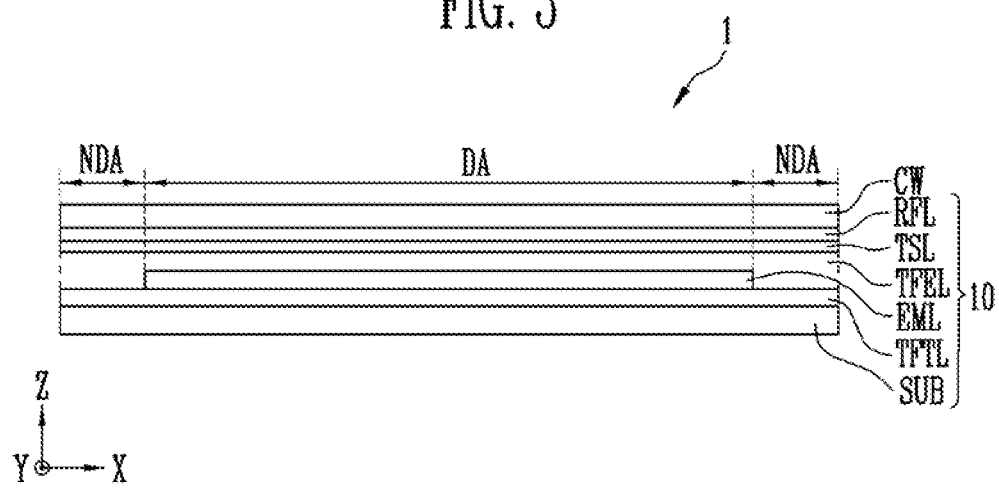
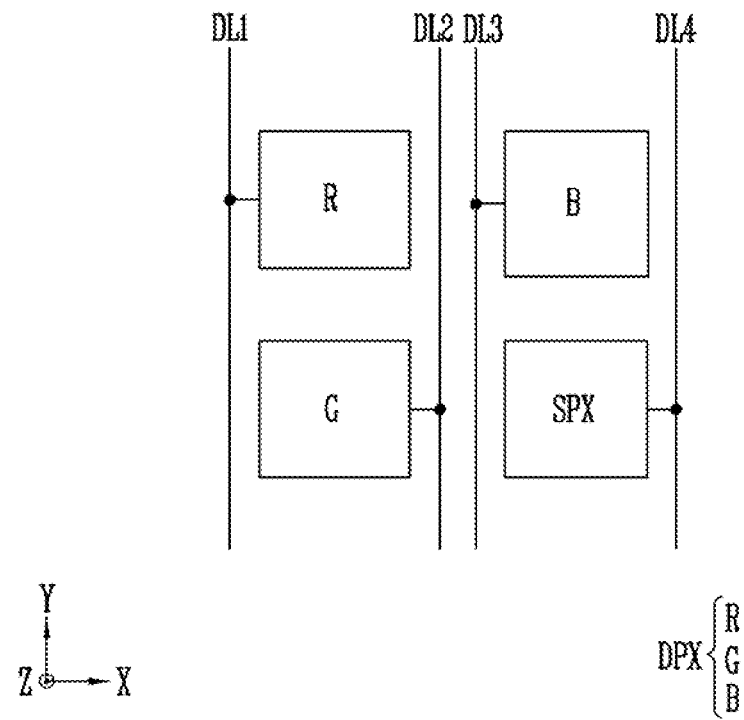

FIG. 11
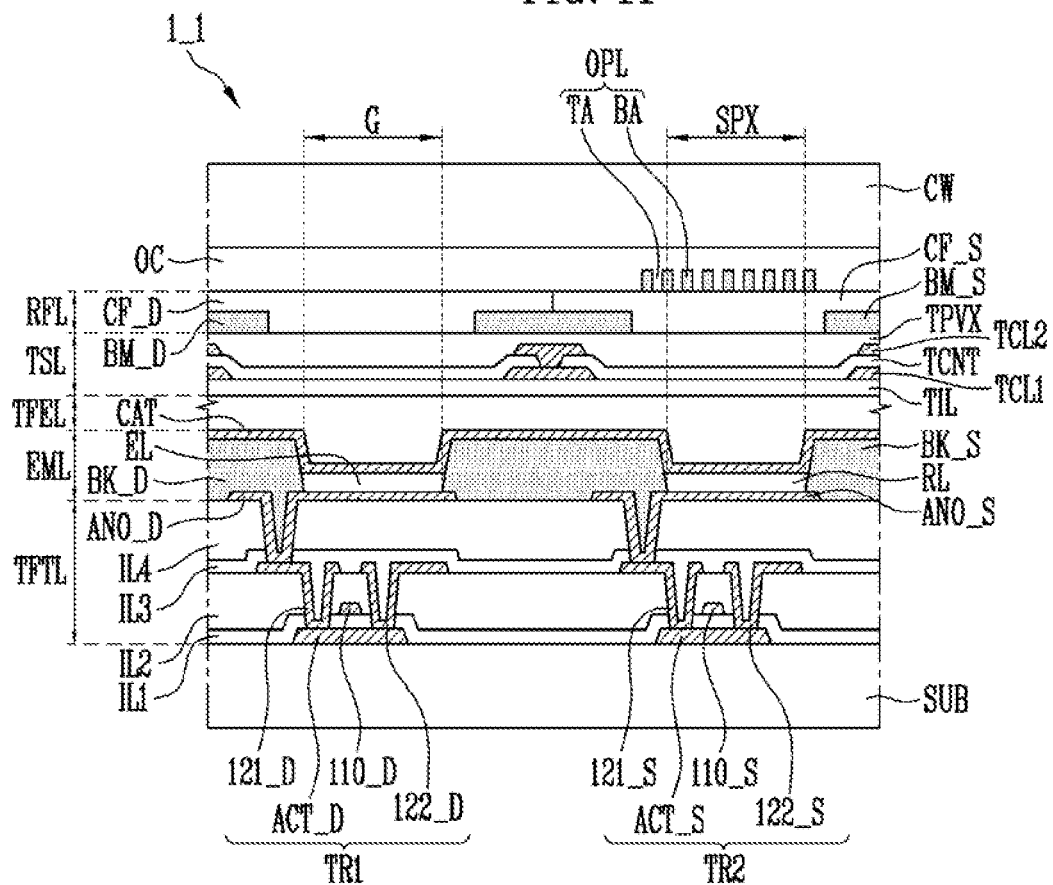
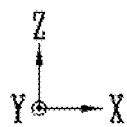

FIG. 12
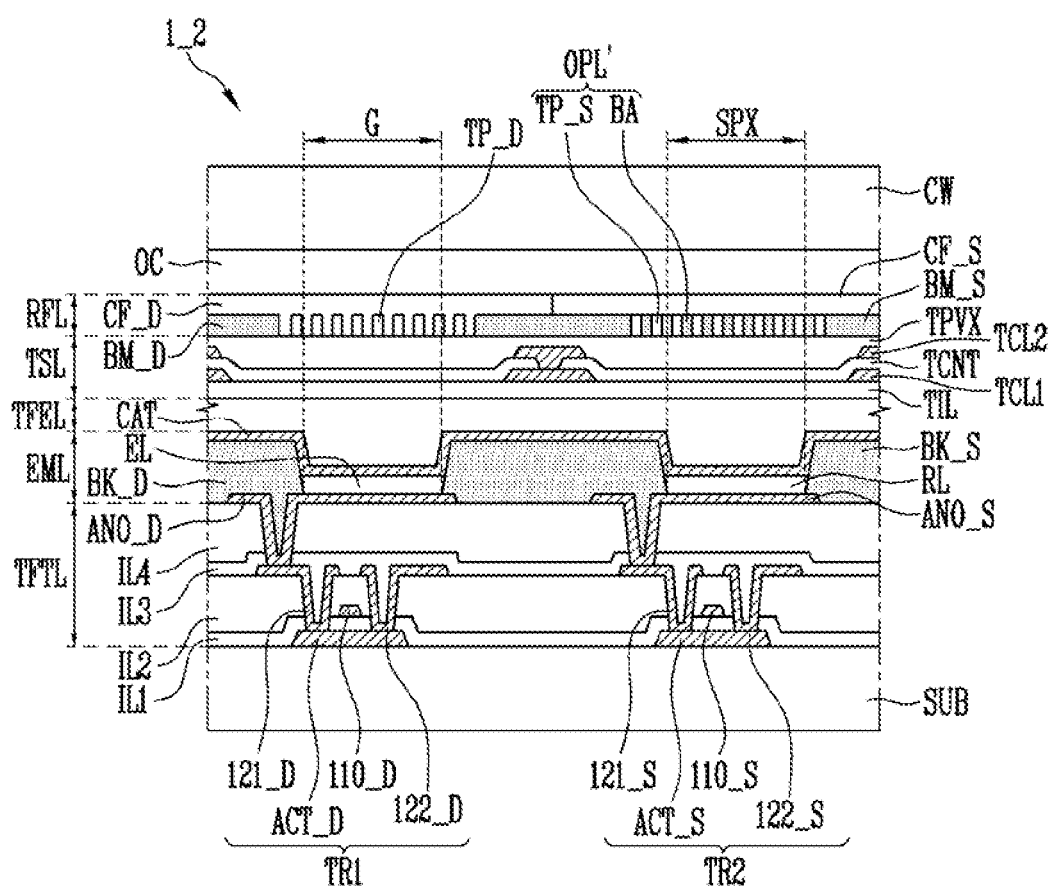
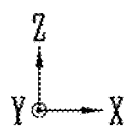

DISPLAY DEVICE INCLUDING AN OPTICAL PATTERN LAYER

This application claims priority under 35 U.S.C. § 119 to Korean Patent Application No. 10-2019-0159161, filed on Dec. 3, 2019, the disclosure of which is incorporated by reference herein in its entirety.

TECHNICAL FIELD

The present invention relates to a display device, and more particularly, to a display device including an optical sensor.

DISCUSSION OF THE RELATED ART

As an information society further develops, demand for a display device for displaying an image is increasing in various forms. For example, the display device is applied to various electronic devices such as a smart phone, a digital camera, a notebook computer, a navigation device, and a smart television. The display device may be a flat panel display device such as a liquid crystal display device, a field emission display device, or an organic light emitting display device.

The organic light emitting display device typically displays an image using an organic light emitting element (for example, an organic light emitting diode (OLED)) that generates light by recombination of an electron and a hole, which produces an exciton that emits light as it approaches a ground state. The organic light emitting display device may have a relatively fast response speed, a relatively high luminance and a relatively large viewing angle, and the organic light emitting display device is driven with low power consumption.

Recently, a display device including a sensor for fingerprint recognition in a display panel of the display device has been under development.

SUMMARY

According to an exemplary embodiment of the present invention, a display device includes: a substrate; a first display pixel disposed on the substrate and including a light emitting element; a first sensor pixel disposed on the substrate and including an optical sensor; a first bank disposed on the substrate, wherein the first display pixel is disposed in the first bank; a first light blocking layer overlapping the first bank; a first color filter disposed on the first light blocking layer and overlapping the light emitting element; and an optical pattern layer disposed on the optical sensor, wherein the optical pattern layer includes a light blocking portion and a plurality of light transmitting portions passing through the light blocking portion.

In an exemplary embodiment of the present invention, the light emitting element includes a first pixel electrode and a light emitting layer disposed on the first pixel electrode, the optical sensor includes a second pixel electrode and a light receiving layer disposed on the second pixel electrode, and the first pixel electrode and the second pixel electrode are formed from the same conductive layer.

In an exemplary embodiment of the present invention, the display device further includes: a common electrode disposed on the light receiving layer and the light emitting layer.

In an exemplary embodiment of the present invention, the display device further includes: a first source electrode and a first drain electrode, wherein the first source electrode or the first drain electrode is electrically connected to the first pixel electrode; and a second source electrode and a second drain electrode, wherein the second source electrode or the second drain electrode is electrically connected to the second pixel electrode, wherein the first source electrode, the first drain electrode, the second source electrode, and the second drain electrode are formed from the same conductive layer.

In an exemplary embodiment of the present invention, the light blocking portion and the first light blocking layer are formed of the same material.

In an exemplary embodiment of the present invention, the display device further includes: a second bank disposed on the substrate, wherein the first sensor pixel is disposed in the second bank, wherein the first bank and the second bank are formed of the same material.

In an exemplary embodiment of the present invention, the display device further includes: a second light blocking layer overlapping the second bank, wherein the first light blocking layer and the second light blocking layer are formed of the same material.

In an exemplary embodiment of the present invention, the display device further includes: a thin film encapsulation layer disposed on the light emitting element and the optical sensor; a cover window disposed on the thin film encapsulation layer; and a touch sensing layer disposed between the thin film encapsulation layer and the cover window.

In an exemplary embodiment of the present invention, the substrate includes: a folding area; a first non-folding area positioned at one side of the folding area; and a second non-folding area positioned at another side of the folding area.

In an exemplary embodiment of the present invention, the optical sensor includes a photo transistor or a photo diode.

In an exemplary embodiment of the present invention, the display device further includes: a second color filter disposed on the optical pattern layer and overlapping the optical sensor.

In an exemplary embodiment of the present invention, the second color filter is disposed on an inner wall of the light blocking portion through the plurality of light transmitting portions.

In an exemplary embodiment of the present invention, the display device further includes: a planarization layer covering the first color filter and the second color filter.

In an exemplary embodiment of the present invention, the display device further includes: a plurality of first transmission patterns disposed on the light emitting element.

In an exemplary embodiment of the present invention, the first color filter is disposed on an upper surface and a side surface of the first transmission pattern.

In an exemplary embodiment of the present invention, the display device further includes: a second transmission pattern disposed in the plurality of light transmitting portions of the optical pattern layer, wherein the second transmission pattern is formed of the same material as the first transmission pattern.

In an exemplary embodiment of the present invention, the second color filter is disposed on the second transmission pattern and an upper surface of the light blocking portion.

In an exemplary embodiment of the present invention, the display device further includes: a second color filter disposed between the optical sensor and the optical pattern layer.

In an exemplary embodiment of the present invention, the display device further includes: a planarization layer disposed on the optical pattern layer, wherein the planarization layer is disposed on an inner wall of the light blocking portion through the plurality of light transmitting portions.

In an exemplary embodiment of the present invention, the planarization layer is in contact with the second color filter through the plurality of light transmitting portions.

BRIEF DESCRIPTION OF THE DRAWINGS

The above and other features of the present invention will become more apparent by describing in detail exemplary embodiments thereof with reference to the accompanying drawings, in which:

FIG. 3 is a cross-sectional view of the display device according to an embodiment of the present invention;

FIG. 4 is an diagram illustrating a configuration of a display pixel and sensor pixels of the display device according to an embodiment of the present invention;

FIG. 11 is a cross-sectional view of the display device according to an embodiment of the present invention; and FIG. 12 is a cross-sectional view of the display device according to an embodiment of the present invention.

DETAILED DESCRIPTION OF THE EMBODIMENTS

Figure 1:
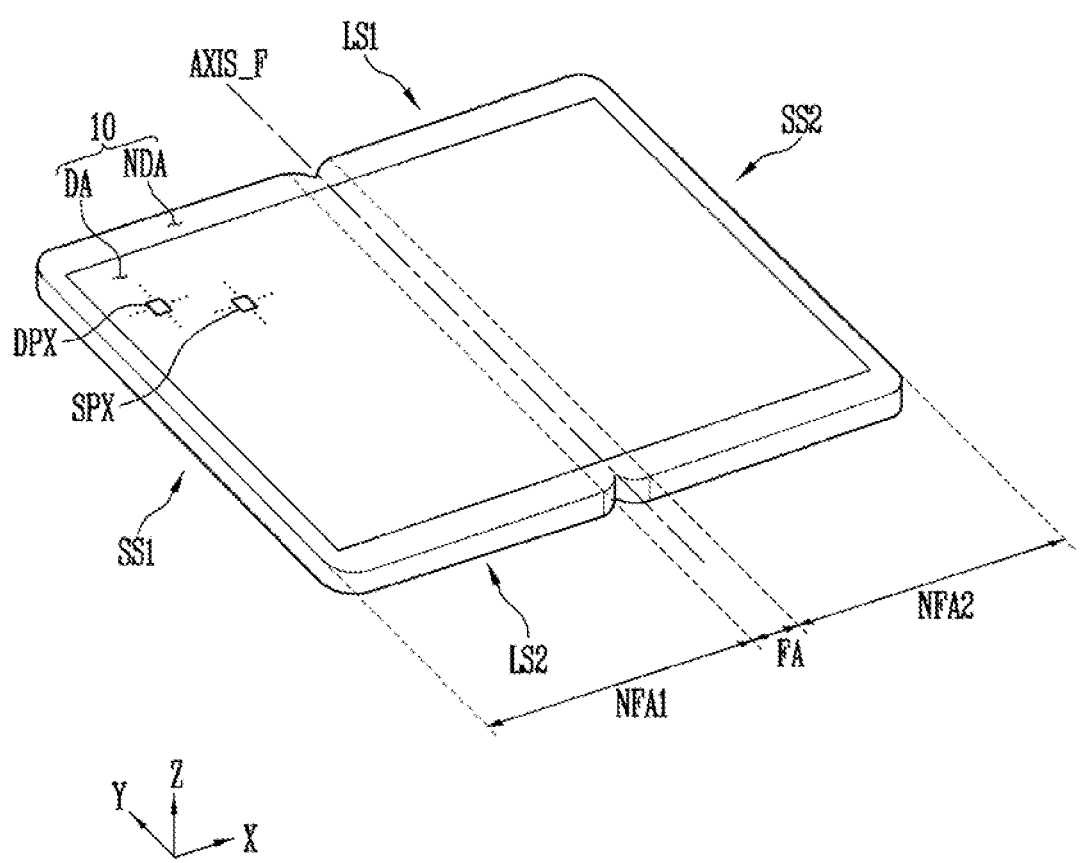
FIG. 1 is a perspective view of a display device according to an embodiment of the present invention.

Exemplary embodiments of the present invention will be described more fully hereinafter with reference to the accompanying drawings. However, the present invention is not limited to the following exemplary embodiments of the present invention, and may be implemented in various different forms.

It will be understood that when an element or layer is referred to as being "on" another element or layer, the element or layer may be directly on another element or layer or intervening elements or layers may be present. The same reference numerals may denote to the same components throughout the specification. A shape, a size, a ratio, an angle, the number, and the like disclosed in the drawings are merely examples, and thus, the present invention is not limited thereto.

Although a first, a second, and the like may be used to describe various components, these components are not limited by these terms. These terms are used only to distinguish one component from another component. Therefore, a first component mentioned below may be termed a second component without departing from the spirit and scope of the present invention.

Each of features of various exemplary embodiments of the present invention may be coupled or combined with each other in part or in whole, and technically, various interlocking and driving are possible. Each exemplary embodiment of the present invention may be implemented independently of each other or exemplary embodiments of the present invention may be implemented together.

Hereinafter, exemplary embodiments of the present invention will be described in more detail with reference to the accompanying drawings.

Figure 2:
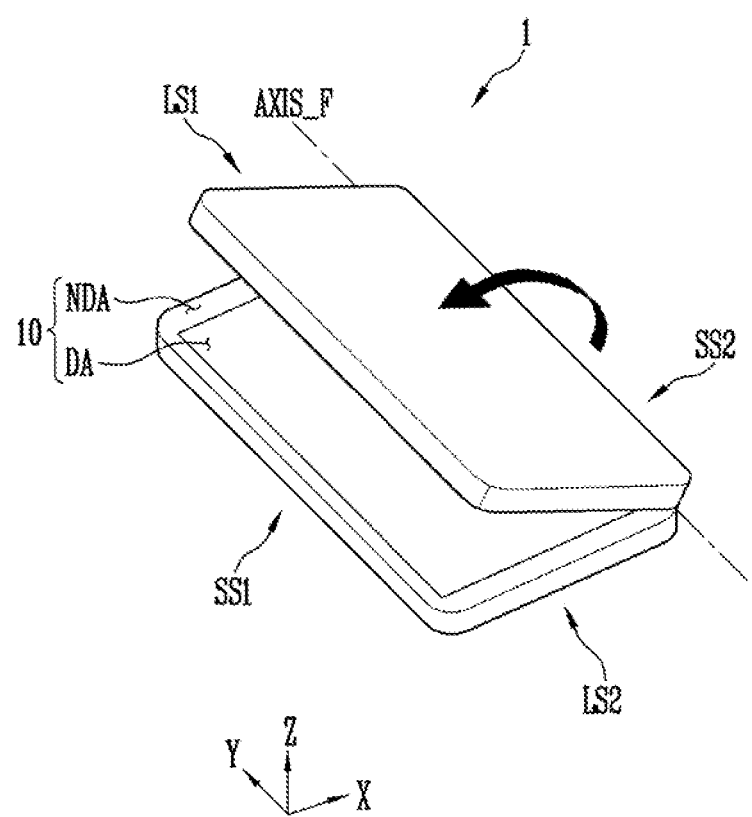
FIG. 2 is a perspective view of a display device in a folded state, according to an embodiment of the present invention.

FIG. 1 is a perspective view of a display device according to an embodiment of the present invention. FIG. 2 is a perspective view of a display device in a folded state, according to an embodiment of the present invention.

In the present specification, "upper portion", "top", and "upper surface" indicate an upper direction, for example, a Z-axis direction with respect to a display device 1, and "lower portion", "bottom", and "lower surface" indicate a lower direction, for example, a direction opposite to the Z-axis direction (e.g., a negative Z-axis direction) with respect to the display device 1. In addition, "left", "right", "up", and "down" indicate directions when viewing the display device 1 in a plan view. For example, "left" indicates a direction opposite to an X-axis direction (e.g., a negative X-axis direction), "right" indicates the X-axis direction, "up" indicates a Y-axis direction, and "down" indicates a direction opposite to the Y-axis direction (e.g., a negative Y-axis direction).

Referring to FIGS. 1 and 2, the display device 10 is a device for displaying a video or a still image. The display device 10 may be used as a display screen of various products such as not only a mobile phone, a smart phone, a tablet PC, a smart watch, a watch phone, a mobile terminal, an electronic notebook, an electronic book, a portable multimedia player (PMP), a navigation device, and an ultra mobile PC (UMPC), but also a television, a notebook computer, a monitor, a billboard, and Internet of things (IOT).

The display device 1 may be a foldable display device. For example, the foldable display device may be foldable, bendable and rollable. For example, the foldable display device may include a flexible state.

The display device 1 may have a planar rectangular shape. The display device 1 may have a planar rectangular shape in which corners form right angles or a corner is rounded. The display device 1 may include four edges LS1, LS2, SS1, and SS2. The display device 1 may include long side edges LS1 and LS2 and short side edges SS1 and SS2. For example, each of the long side edges LS1 and LS2 may extend in a first direction (X-axis direction), and each of the short side edges SS1 and SS2 may extend in a second direction (Y-axis direction).

The display device 1 may include a folding axis AXIS_F extending in the second direction (Y-axis direction). The display device 1 may be folded at the folding axis AXIS_F. The folding axis AXIS_F may extend across each of the long side edge LS1 and LS2. In this case, each of the long side edges LS1 and LS2 of the display device 1 may be folded, but the present invention is not limited thereto. For example, the folding axis AXIS_F may extend across each of the short side edges SS1 and SS2, and in this case, each of the short side edges SS1 and SS2 of the display device 1 may be folded along the folding axis AXIS_F.

The display device 1 may include a folding area FA (or, e.g., foldable area), first and second non-folding areas NFA1 and NFA2 (or, e.g., non-foldable areas). The first and second non-folding areas NFA1 and NFA2 may be a portion that does not have flexibility or having a small degree of bending by external pressure. For example, the first and second non-folding areas NFA1 and NFA2 may have a relatively high rigidity.

The folding area FA may be positioned between the first and second non-folding areas NFA1 and NFA2. The folding area FA may have flexibility, may have a large degree of bending by external pressure, and may be folded or unfolded. The first and second non-folding areas NFA1 and NFA2 and the folding area FA may be mutually connected to each other or integrally implemented, and may be distinguished from each other by a hard layer (for example, a metal plate disposed on a rear surface of the display device 1 to support an upper structure). The display device 1 may be in-folded so that a display area DA faces inward or out-folded so that the display area DA faces outward.

The display device 1 includes the display panel 10 displaying an image. The display panel 10 may include a display area DA and a non-display area NDA.

The display area DA is an area for displaying an image and may include a plurality of display pixels DPX. In addition, the display area DA may be used as a detection member for detecting an external environment. For example, the display area DA may include a fingerprint recognition area for recognizing a fingerprint of a user. For example, the display area DA may correspond to a fingerprint recognition area for recognizing a fingerprint of a user. Therefore, the display area DA may include the plurality of display pixels DPX and a plurality of sensor pixels SPX.

The non-display area NDA may be the remaining area except for the display area DA in the display panel 10. For example, the non-display area NDA may be adjacent to the display area DA. For example, the non-display area NDA may include a scan driver for applying scan signals to scan lines, fan out lines connecting data lines and a display driver to each other, and pads connected to a circuit board.

The non-display area NDA may be formed to be opaque. The non-display area NDA may be formed as a decor layer in which a pattern that may be displayed to the user is formed. In a state in which the display device 1 is folded, areas of the display area DA divided based on the folding axis AXIS_F may be stacked on each other. In a state in which the display device 1 is unfolded again, a screen may be displayed in the display area DA in a state in which each of the areas is unfolded. For example, the first non-folding area NFA1 and the second non-folding area NFA2 form a substantially flat surface to provide a screen in the display area DA when in an unfolded state.

FIG. 3 is a cross-sectional view of the display device according to an embodiment of the present invention.

Referring to FIG. 3, the display device 1 may include the display panel 10 and a cover window CW.

The display panel 10 may be a light emitting display panel including a light emitting element. For example, the display panel 10 may be an organic light emitting display panel using an organic light emitting diode including an organic light emitting layer, a micro light emitting diode (LED) display panel using a micro LED, a quantum dot light emitting display panel using a quantum dot light emitting diode including a quantum dot emitting layer, or an inorganic light emitting display panel using an inorganic light emitting element including an inorganic semiconductor.

Hereinafter, the description will be given based on an example in which the display panel 10 is the organic light emitting display panel.

The display panel 10 may include a substrate SUB, a thin film transistor layer TFTL, a light emitting element layer EML, a thin film encapsulation layer TFEL, and a touch sensing layer TSL.

The substrate SUB may be formed of a material having flexibility such that it can be bent or folded. For example, the material having flexibility may include at least one of polystyrene (PS), polyvinyl alcohol (PVA), poly methyl metha acrylate (PMMA), polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and/or cellulose acetate propionate (CAP). However, the material of the substrate SUB may be variously changed, and may also be formed of fiber glass plastic (FRP) or the like.

The thin film transistor layer TFTL may be disposed on the substrate SUB. The thin film transistor layer TFTL may include at least one thin film transistor for driving each of the plurality of display pixels and the sensor pixels. Each of the thin film transistors may include a gate electrode, a semiconductor layer, a source electrode, and a drain electrode. The thin film transistor layer TFTL may further include scan lines connected to the thin film transistors, data lines, power lines, scan control lines, and routing lines connecting pads and data lines.

The thin film transistor layer TFTL may be disposed in the display area DA and the non-display area NDA. For example, the thin film transistors, the scan lines, the data lines, and the power lines of the thin film transistor layer TFTL may be disposed in the display area DA. In addition, the scan control lines and the routing lines of the thin film transistor layer TFTL may be disposed in the non-display area NDA.

The light emitting element layer EML is disposed on the thin film transistor layer TFTL. The light emitting element layer EML may include a light emitting element including a first pixel electrode, a light emitting layer, and a common electrode. The light emitting element layer EML may further include an optical sensor including a second pixel electrode, a light receiving layer, and a common electrode. The light emitting element and the optical sensor may be disposed on the same layer. Therefore, since a thickness of the display panel 10 may be minimized, a folding characteristic of the display device 1 may be improved. Detailed description thereof will be described later with reference to FIG. 5.

The thin film encapsulation layer TFEL may be disposed on the light emitting element layer EML. The thin film encapsulation layer TFEL may prevent oxygen or moisture from penetrating into the light emitting element layer EML. To this end, the thin film encapsulation layer TFEL may include at least one inorganic film. The inorganic film may be a silicon nitride (SiNx) layer, a silicon oxy nitride (SiON) layer, a silicon oxide (SiOx) layer, a titanium oxide (TiOx) layer, or an aluminum oxide (AlOx) layer, but the present invention is not limited thereto.

In addition, the thin film encapsulation layer TFEL may protect the light emitting element layer EML from a foreign substance such as dust. To this end, the thin film encapsulation layer TFEL may additionally include at least one organic film. The organic film may be an acryl resin, an epoxy resin, a phenolic resin, a polyamide (PA) resin, or a polyimide (PI) resin, but the present invention is not limited thereto.

The thin film encapsulation layer TFEL may be disposed over the display area DA and the non-display area NDA. For example, the thin film encapsulation layer TFEL may be disposed to cover the light emitting element layer EML and the thin film transistor layer TFTL of the display area DA and the non-display area NDA.

The touch sensing layer TSL may be disposed on the thin film encapsulation layer TFEL. The touch sensing layer TSL may be directly disposed on the thin film encapsulation layer TFEL. In the specification, "directly disposed" refers to "formed by continuous process", except for attaching components to each other by using a separate adhesive layer. By being disposed directly on the thin film encapsulation layer TFEL, the thickness of the display device 1 may be reduced in comparison with a case where a separate sensing panel including the touch sensing layer TSL is attached on the thin film encapsulation layer TFEL. However, the present invention is not limited thereto, and another layer such as an adhesive layer or a substrate may be interposed between the display panel 10 and the touch sensing layer TSL.

The touch sensing layer TSL may be disposed on a surface on which the image is emitted from the display panel 10 and can sense a touch input of the user. The touch sensing layer TSL may recognize a touch event of the display device 1 through a hand of the user or a separate input means. For example, the touch sensing layer TSL may recognize the touch event in a capacitive manner.

The touch sensing layer TSL layer may include a plurality of touch electrodes and a plurality of sensing lines. The touch electrodes and the sensing lines may have a single layer structure or a multilayer structure.

The touch electrodes and the sensing lines may include, for example, indium tin oxide (ITO), indium zinc oxide (IZO), zinc oxide (ZnO), indium tin zinc oxide (ITZO), PEDOT, a metal nanowire, and/or graphene. The touch electrodes and the sensing lines may include a metal layer, such as molybdenum (Mo), silver (Ag), titanium (Ti), copper (Cu), aluminum (Al), or an alloy thereof. The touch electrodes and the sensing lines may have the same layer structure or different layer structures.

An antireflection layer RFL may be disposed on the touch sensing layer TSL. The antireflection layer RFL may serve to block external light reflection. To this end, the antireflection layer RFL may include a light blocking layer formed of a light blocking material. Therefore, since a separate polarizing plate may be omitted, a luminance reduction of the display device 1 may be prevented and the thickness of the display panel 10 may be minimized.

The cover window CW may be disposed on the display panel 10. The cover window CW may be disposed on the antireflection layer RFL of the display panel 10. The cover window CW may protect the display panel 10 from an external impact and provide an input surface and/or a display surface to the user. The cover window CW may be coupled to the display panel 10 through an optically transparent adhesive member.

The cover window CW may be formed of a material having flexibility so that all or a portion of the cover window CW may be bent or folded. For example, the cover window CW may have a multilayer structure selected from a plastic film and a plastic substrate. The multilayer structure may be formed through a continuous process or an adhesive process using an adhesive layer. An example of a plastic that may be applied to the cover window CW may include polyimide (PI), polyacrylate (PA), poly methyl metha acrylate (PMMA), polycarbonate (PC), polyethyenenaphthalate (PEN), polyvinylidene chloride (PVDC), polyvinylidene difluoride (PVDF), polystyrene (PS), ethylene vinyl alcohol copolymer (EVOH), polyethersulphone (PES), polyetherimide (PEI), polyphenylene sulfide (PPS), polyarylate (PAR), tri-acetyl cellulose (TAC), cellulose acetate propionate (CAP), or the like, but present invention is not limited thereto.

A protective layer may be further disposed on a lower surface of the display panel 10, for example, a surface on which the touch sensing layer TSL is not disposed. The protective layer may protect the display panel 10 by absorbing and/or dispersing an external impact applied to the display panel 10. In addition, the protective layer may block oxygen, moisture, and the like from flowing into the display panel 10 from the outside. The protective layer may be configured in a film shape to further secure flexibility of the display device 1.

FIG. 4 is an diagram illustrating a configuration of the display pixel and the sensor pixel of the display device according to an embodiment of the present invention.

Referring to FIG. 4, the display pixel DPX may indicate sub pixels of a group, which may express a grayscale. Each display pixel DPX may include a plurality of sub pixels R, G, and B. The sub pixels R, G, and B may include a first sub pixel R emitting a first color, a second sub pixel G emitting a second color, and a third sub pixel emitting a third color B. One first sub pixel R, one second sub pixel G, and one third sub pixel B may form one display pixel DPX. On a plan view, the first sub pixel R and the third sub pixel B may be disposed along the first direction (X-axis direction) in a first row. In addition, the second sub pixel G and the sensor pixel SPX may be disposed along the first direction (X-axis direction) in a second row. However, the present invention is not limited thereto.

Data lines DL1, DL2, DL3, DL4 respectively connected to the plurality of pixels DPX and SPX may be provided. The data lines DL1, DL2, DL3, DL4 may extend along the second direction (Y-axis direction).

The data lines DL1, DL2, DL3, DL4 may include first to fourth data lines DL1, DL2, DL3, and DL4. The first to fourth data lines DL1, DL2, DL3, and DL4 may extend along the second direction (Y-axis direction) and may be sequentially arranged along the first direction (X-axis direction). The first data line DL1 may be connected to the first sub pixel R, the second data line DL2 may be connected to the second sub pixel G, the third data line DL3 may be connected to the third sub pixel B, and the fourth data line DL4 may be connected to the sensor pixel SPX.

Figure 5:
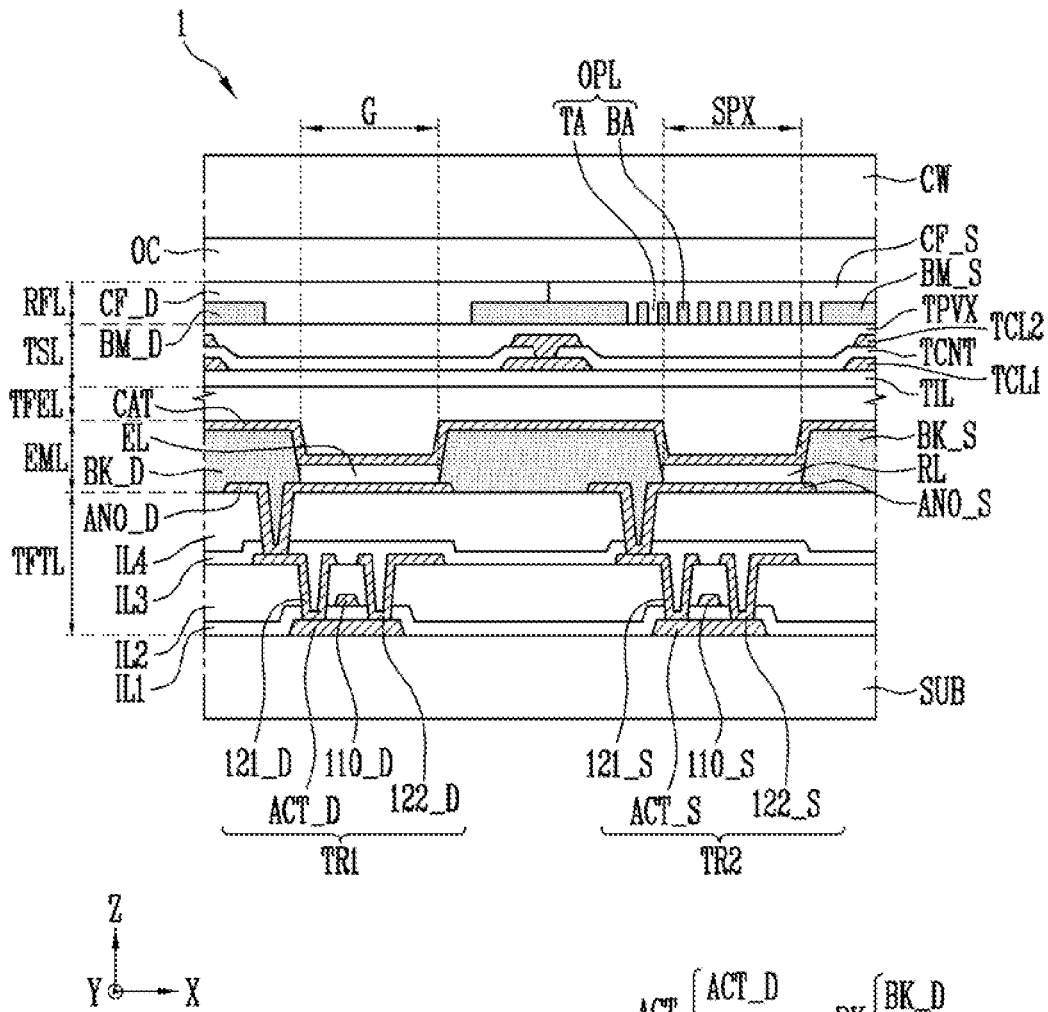
FIG. 5 is a cross-sectional view of the display pixel and the sensor pixel of the display device according to an embodiment of the present invention.
Figure 6:
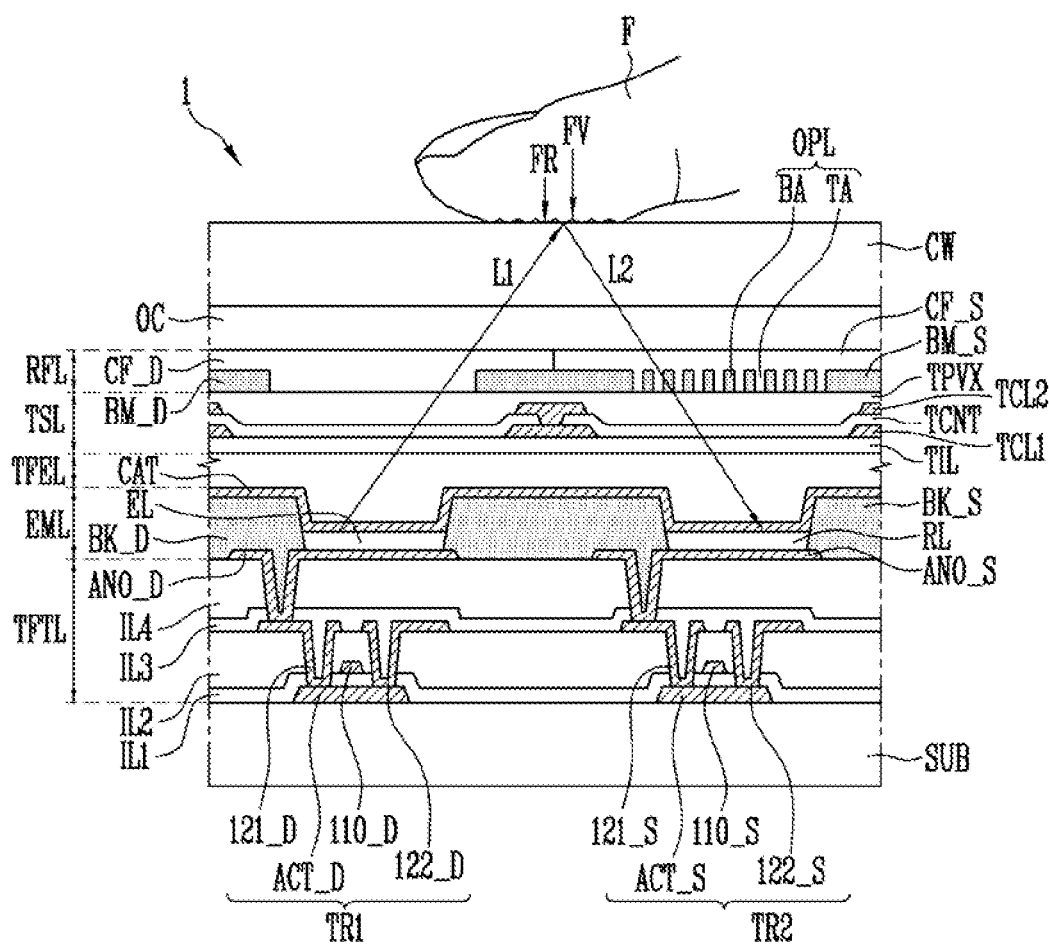
FIG. 6 is a cross-sectional view illustrating a reflection path of light in the display device of FIG. 5.

FIG. 5 is a cross-sectional view of the display pixel and the sensor pixel of the display device according to an embodiment of the present invention. FIG. 6 is a cross-sectional view illustrating a reflection path of light in the display device of FIG. 5.

Referring to FIGS. 5 and 6, the display device 1 may include the substrate SUB, a light emitting element OLED, a light emitting element transistor TR1, an optical sensor OPD, an optical sensor transistor TR2, and the like. For convenience of description, FIGS. 5 and 6 illustrate a cross-sectional structure of the display pixel DPX using the second sub pixel G among the display pixels DPX as an example.

The substrate SUB may support each of layers disposed thereon. A semiconductor layer ACT is disposed on the substrate SUB. A buffer layer may be further disposed between the substrate SUB and the semiconductor layer ACT. The buffer layer may prevent diffusion of an impurity ion and prevent penetration of moisture.

The semiconductor layer ACT may form a channel for a plurality of transistors. For example, the semiconductor layer ACT may include a first semiconductor layer ACT_D of the light emitting element transistor TR1 and a second semiconductor layer ACT_S of the optical sensor transistor TR2.

The semiconductor layer ACT may include polycrystalline silicon. The polycrystalline silicon may be formed by crystallizing amorphous silicon. When the semiconductor layer ACT is formed of the polycrystalline silicon, and when an ion is doped to the semiconductor layer ACT, the semiconductor layer ACT to which the ion is doped may have conductivity.

In an exemplary embodiment of the present invention, the semiconductor layer ACT may include monocrystalline silicon, low temperature polycrystalline silicon, amorphous silicon, or an oxide semiconductor. For example, the oxide semiconductor may include binary component compound (ABx), a ternary component compound (ABxCyDz), and a quaternary component compound containing indium (In), zinc (Zn), gallium (Ga), tin (Sn), titanium (Ti), aluminum (Al), hafnium (Hf), zirconium (Zr), magnesium (Mg), and the like, In an exemplary embodiment of the present invention, the semiconductor layer ACT may include indium tin zinc oxide (ITZO) or indium gallium zinc oxide (IGZO).

A first insulating layer IL1 is disposed on the semiconductor layer ACT. The first insulating layer IL1 may be disposed on the substrate SUB. For example, the first insulating layer IL1 may be disposed on the entire surface of the substrate SUB. The first insulating layer IL1 may be a gate insulating film having a gate insulating function. The first insulating layer IL1 may include a silicon compound, a metal oxide, or the like. For example, the first insulating layer IL1 may include silicon oxide (SiOx), silicon nitride (SiNx), silicon oxynitride (SiON), aluminum oxide (SiOx), tantalum oxide (TaOx), hafnium oxide (HfOx), zirconium oxide (ZrOx), titanium oxide (TiOx), or the like. The first insulating layer IL1 may be a single film or a multilayer film formed of a stack film of different materials.

A first conductive layer 110 is disposed on the first insulating layer IL1. The first conductive layer 110 may include at least one metal material such as molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and/or copper (Cu). The first conductive layer 110 may be a single film or a multilayer film.

The first conductive layer 110 may include a first gate electrode 110_D of the light emitting element transistor TR1 and a second gate electrode 110_S of the optical sensor transistor TR2. The first gate electrode 110_D may overlap the first semiconductor layer ACT_D described above. The second gate electrode 110_S may overlap the second semiconductor layer ACT_S described above.

A second insulating layer IL2 is disposed on the first conductive layer 110. The second insulating layer IL2 may be disposed on the substrate SUB. For example, the second insulating layer IL2 may be disposed on the entire surface of the substrate SUB. The second insulating layer IL2 may insulate the first conductive layer 110 from a second conductive layer 120. For example, the second insulating layer IL2 may be an interlayer insulating film. The second insulating layer IL2 may include the same material as the above-described first insulating layer IL1 or may include one or more materials selected from the materials used as an example for the configuration material of the first insulating layer IL1.

A second conductive layer 120 is disposed on the second insulating layer IL2. The second conductive layer 120 may include at least one metal material such as aluminum (Al), molybdenum (Mo), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and/or copper (Cu). The second conductive layer 120 may be a single film or a multilayer film. For example, the second conductive layer 120 may be formed of a stack structure such as Ti/A/Ti, Mo/Al/Mo, Mo/AlGe/Mo, or Ti/Cu.

The second conductive layer 120 may include a first source electrode 121_D and a first drain electrode 122_D of the light emitting element transistor TR1, and a second source electrode 121_S and a second drain electrode 122_S of the optical sensor transistor TR2.

The first source electrode 121_D may be connected to a source region of the first semiconductor layer ACT_D through a contact hole passing through the second insulating layer IL2 and the first insulating layer IL1, and exposing one end of the first semiconductor layer ACT_D. In addition, the first drain electrode 122_D may be connected to a drain region of the first semiconductor layer ACT_D through a contact hole passing through the second insulating layer IL2 and the first insulating layer IL1, and exposing another end of the first semiconductor layer ACT_D.

The second source electrode 121_S may be connected to a source region of the second semiconductor layer ACT_S through a contact hole passing through the second insulating layer IL2 and the first insulating layer IL1, and exposing one end of the second semiconductor layer ACT_S. In addition, the second drain electrode 122_S may be connected to a drain region of the second semiconductor layer ACT_S through a contact hole passing through the second insulating layer IL2 and the first insulating layer IL1, and exposing another end of the second semiconductor layer ACT_S.

A third insulating layer IL3 is disposed on the second conductive layer 120. The third insulating layer IL3 may be disposed on the light emitting element transistor TR1 and the optical sensor transistor TR2 to protect the transistors. The third insulating layer IL3 may include the same material as the above-described first insulating layer IL1 or may include one or more materials selected from the materials used as an example for the configuration material of the first insulating layer IL1.

A fourth insulating layer IL4 may be disposed on the third insulating layer IL3. For example, the fourth insulating layer IL4 may be a via layer. The fourth insulating layer IL4 may include an organic insulating material such as an acrylic resin (or polyacrylates resin), an epoxy resin, a phenolic resin, a polyamides resin, a polyimides resin, an unsaturated polyesters resin, a poly phenylenethers resin, a polyphenylenesulfides resin, or benzocyclobutene (BCB).

The light emitting element OLED and the optical sensor OPD are disposed on the fourth insulating layer IL4. Since the thickness of the display panel 10 may be minimized by disposing the light emitting element OLED and the optical sensor OPD on the same layer, the folding characteristic of the display device 1 may be improved.

The light emitting element OLED may be an organic light emitting element that generates light by recombination of an electron and a hole, but the present invention is not limited thereto. The light emitting element OLED may be connected to the light emitting element transistor TR1. The light emitting element OLED may include a first pixel electrode ANO_D, a light emitting layer EL, and a common electrode CAT.

For example, the optical sensor OPD may be an optical fingerprint sensor. For example, the optical sensor OPD may be formed of a photo diode, a complementary metal-oxide-semiconductor (CMOS) image sensor, a charge-coupled device (CCD) camera, a photo transistor, or the like, but the present invention is not limited thereto. The optical sensor OPD may recognize a fingerprint by sensing light reflected by a ridge FR and a valley FV between the ridges FR of a finger F.

For example, when the finger F of the user touches the cover window CW, first light L1 output from the light emitting element OLED may be reflected by the ridge FR or the valley FV of the finger F, and reflected second light L2 may pass through a light transmitting portion TA of an optical pattern layer OPL to reach the optical sensor OPD. The optical sensor OPD may distinguish between the second light L2 reflected from the ridge FR of the finger F and the second light L2 reflected from the valley FV of the finger F to recognize a pattern of the fingerprint of the user.

The optical sensor OPD may be connected to the optical sensor transistor TR2. The optical sensor OPD may include a second pixel electrode ANO_S, a light receiving layer RL, and a common electrode CAT.

The first pixel electrode ANO_D and the second pixel electrode ANO_S may be formed of a pixel electrode layer ANO.

The pixel electrode layer ANO may be formed of a metal material having a high reflectance such as a stack structure of aluminum and titanium (Ti/Al/Ti), a stack structure of aluminum and ITO (ITO/Al/ITO), an APC alloy, and a stack structure of APC alloy and ITO (ITO/APC/ITO), but the present invention is not limited thereto.

The first pixel electrode ANO_D may be connected to the first source electrode 121_D through a contact hole passing through the fourth insulating layer IL4 and the third insulating layer IL3. However, the present invention is not limited thereto, and for example, the first pixel electrode ANO_D may be connected to the first drain electrode 122_D.

The second pixel electrode ANO_S may be connected to the second source electrode 121_S through a contact hole passing through the fourth insulating layer IL4 and the third insulating layer IL3. However, the present invention is not limited thereto, and for example, the second pixel electrode ANO_S may be connected to the second drain electrode 122_S.

A bank layer BK may be disposed on the pixel electrode layer ANO.

The bank layer BK may be formed of an organic film such as an acrylic resin, an epoxy resin, a phenolic resin, a polyamide resin, or a polyimide resin.

In addition, the bank layer BK may include a light absorbing material, or a light absorbing agent may be applied to absorb light introduced from the outside. For example, the bank layer BK may include a carbon-based black pigment. However, the present invention is not limited thereto, and the bank layer BK include an opaque metal material such as chrome (Cr), molybdenum (Mo), an alloy of molybdenum and titanium (MoTi), tungsten (W), vanadium (V), niobium (Nb), tantalum (Ta), manganese (Mn), cobalt (Co), or nickel (Ni) having high light absorption.

The bank layer BK may include a first bank BK_D and a second bank BK_S. The first bank BK_D may be disposed on the first pixel electrode ANO_D, and the second bank BK_S may be disposed on the second pixel electrode ANO_S.

The first bank BK_D may include an opening portion that exposes the first pixel electrode ANO_D. The opening portion of the first bank BK_D may form a light emitting area of the display pixel DPX. For convenience of description, only the light emitting area of the second sub pixel G is illustrated in FIG. 5.

The second bank BK_S may include an opening portion that exposes the second pixel electrode ANO_S. The opening portion of the second bank BK_S may form a light receiving area of the sensor pixel S.

The light emitting layer EL is disposed in the opening portion of the first bank BK_D. The light emitting layer EL may include an organic material to emit a predetermined color. For example, the light emitting layer EL may include a hole transporting layer, an organic material layer, and an electron transporting layer.

A light receiving layer RL is disposed in the opening portion of the second bank BK_S. The light receiving layer RL may serve to absorb and detect the second light L2 reflected or scattered from the fingerprint of the finger F of the user. The fingerprint may be recognized by sensing a difference between amounts of light that is reflected or scattered, from the ridge and the valley of the fingerprint of the finger F of the user, and absorbed by the light receiving layer RL. The hole and the electron generated by the light receiving layer RL absorbing the light may be transferred to each of the second pixel electrode ANO_S and the common electrode CAT.

The light receiving layer RL may be formed of an organic photosensitive material. For example, the organic photosensitive material may include a dithiolene-based material (BDN) (bis(4-dimethylaminodithiobenzyl) nickel(II)), a benzotriazole-based high molecular compound (PTZBTTT-BDT), a porphyrin-based small molecule material (DHTBTEZP), or the like, but the present invention is not limited thereto.

An electron blocking layer may be further disposed between the light receiving layer RL and the second pixel electrode ANO_S. The electron blocking layer may block an electron generated in the light receiving layer RL from moving to the second pixel electrode ANO_S.

The common electrode CAT may be disposed on the light emitting layer EL and the light receiving layer RL. The common electrode CAT may be disposed on the substrate SUB. For example, the common electrode CAT may be disposed on the entire surface of the substrate SUB. For example, the common electrode CAT may not be divided by the display pixel DPX and the sensor pixel SPX, and may be implemented in a form of an electrode common to all pixels. For example, the common electrode CAT may be continuously disposed on the display pixels DPX and the sensor pixels SPX.

The common electrode CAT may include a material layer having a low work function such as Li, Ca, LiF/Ca, LiF/Al, Al, Mg, Ag, Pt, Pd, Ni, Au Nd, Ir, Cr, BaF, Ba, or a compound or mixture thereof (for example, a mixture of Ag and Mg, or the like). The common electrode CAT may further include a transparent metal oxide layer disposed on the material layer having a low work function.

The display device 1 according to an exemplary embodiment of the present invention may minimize the thickness of the display device 1 by disposing the light emitting element OLED and the optical sensor OPD on the same layer.

Therefore, since the folding characteristic may be improved, the foldable display device 1 may be easily implemented.

The thin film encapsulation layer TFEL is disposed on the common electrode CAT. Since the thin film encapsulation layer TFEL has been described with reference to FIG. 3, a repetitive description may be omitted.

The touch sensing layer TSL is disposed on the thin film encapsulation layer TFEL.

The touch sensing layer TSL includes a touch insulating layer TIL, a touch contact layer TCNT, a touch protection layer TPVX, a first touch conductive layer TCL1, and a second touch conductive layer TCL2. Each of the above-described layers may be formed of a single film, but may be formed of a stack film including a plurality of films. Another layer may be further disposed between each layer.

The touch insulating layer TIL may include an inorganic film. However, the present invention is not limited thereto, and for example, the touch insulating layer TIL may be formed of an organic film, or may have a structure in which an inorganic film and an organic film are alternately stacked.

For example, the inorganic film may include at least one of aluminum oxide (AlOx), titanium oxide (TiOx), silicon oxide (SiOx), silicon oxynitride (SiON), zirconium oxide (ZrOx), and/or hafnium oxide (HfOx).

For example, the organic film may include at least one of an acrylic resin, a methacryl resin, a polyisoprene, a vinyl resin, an epoxy resin, an urethane resin, a cellulose resin, a siloxane resin, a polyimide (PI) resin, a polyamide (PA) resin, and/or a perylene resin.

The first touch conductive layer TCL1 may be disposed on the touch insulating layer TIL. The first touch conductive layer TCL1 may include molybdenum (Mo), titanium (Ti), copper (Cu), aluminum (Al), and an alloy thereof. The first touch conductive layer TCL1 may form a first layer of the plurality of touch electrodes in the touch sensing layer TSL. The first touch conductive layer TCL1 may be disposed to overlap the first bank BK_D and the second bank BK_S to prevent reduction of an opening ratio of the display pixel DPX and the sensor pixel SPX.

The touch contact layer TCNT may be disposed on the first touch conductive layer TCL1. The touch contact layer TCNT insulates the first touch conductive layer TCL1 from the second touch conductive layer TCL2. The touch contact layer TCNT may include the same material as the above-described touch insulating layer TIL, or may include one or more materials selected from the materials used as an example for the configuration material of the touch insulating layer TIL. For example, the touch contact layer TCNT may include an inorganic film, but the present invention is not limited thereto.

The second touch conductive layer TCL2 may be disposed on the touch contact layer TCNT. The second touch conductive layer TCL2 may include the same material as the above-described first touch conductive layer TCL1 or may include one or more materials selected from the materials used as an example for the configuration material of the first touch conductive layer TCL1.

The second touch conductive layer TCL2 may form a second layer of the plurality of touch electrodes of the touch sensing layer TSL. The second touch conductive layer TCL2 may be electrically connected to the first touch conductive layer TCL1 through a contact hole passing through the touch contact layer TCNT. The second touch conductive layer TCL2 may be disposed to overlap the first bank BK_D and the second bank BK_S to prevent reduction of the opening ratio of the display pixel DPX and the sensor pixel SPX.

The touch protection layer TPVX may be disposed on the second touch conductive layer TCL2. The touch protection layer TPVX may include an organic film. However, the present invention is not limited thereto, and the touch protection layer TPVX may be formed of an inorganic film, or may have a structure in which an organic film and an inorganic film are alternately stacked.

For example, the organic film may include at least one of an acrylic resin, a methacryl resin, a polyisoprene, a vinyl resin, an epoxy resin, an urethane resin, a cellulose resin, a siloxane resin, a polyimide resin, a polyamide resin, and/or a perylene resin.

For example, the inorganic film may include at least one of aluminum oxide (AlOx), titanium oxide (TiOx), silicon oxide (SiOx), silicon oxynitride (SiON), zirconium oxide (ZrOx), and/or hafnium oxide (HfOx).

The antireflection layer RFL is disposed on the touch sensing layer TSL. Since the antireflection layer RFL may serve to block reflection of external light, a separate polarizing plate may be omitted. Therefore, luminance reduction of the display device 1 may be prevented and the thickness of the display panel 10 may be minimized.

The antireflection layer RFL may include a light blocking layer BM and a color filter CF.

The light blocking layer BM may be disposed on the touch protection layer TPVX.

The light blocking layer BM may include an organic light blocking material. For example, the organic light blocking material may include at least one of carbon black (CB) and/or titanium black (TiBK), but present invention is not limited thereto.

The light blocking layer BM may be disposed to overlap the bank layer BK. For example, the light blocking layer BM may overlap the bank layer BK in the third direction (Z-axis direction).

The light blocking layer BM may include a first light blocking layer BM_D overlapping the first bank BK_D and a second light blocking layer BM_S overlapping the second bank BK_S.

The first light blocking layer BM_D and the second light blocking layer BM_S may each include an opening portion.

The opening portion of the first light blocking layer BM_D provides an optical path for allowing the first light L1 emitted from the light emitting element OLED to progress to the cover window CW and go above the display device 1. To this end, the opening portion of the first light blocking layer BM_D may be disposed to overlap the light emitting element OLED.

The opening portion of the second light blocking layer BM_S provides an optical path for allowing the second light L2 reflected from the fingerprint of the finger F of the user to progress to the optical sensor OPD. To this end, the opening portion of the second light blocking layer BM_S may be disposed to overlap the optical sensor OPD.

The color filter CF may be disposed on the light blocking layer BM.

The color filter CF may include a first color filter CF_D disposed on the first light blocking layer BM_D and a second color filter CF_S disposed on the second light blocking layer BM_S.

The first color filter CF_D may be disposed in the opening portion of the first light blocking layer BM_D and may be in direct contact with the touch protection layer TPVX exposed by the opening portion of the first light blocking layer BM_D. For example, the first color filter CF_D may extend from an edge of the opening portion of the first light blocking layer BM_D to an upper surface of the first light blocking layer BM_D and may be in direct contact with the upper surface of the first light blocking layer BM_D. The first color filter CF_D may be disposed to overlap the light emitting element OLED. For example, the first color filter CF_D may be disposed to overlap the display pixel DPX. For convenience of description, only the second sub pixel G is illustrated in FIG. 5, and the first color filter CF_D may be a green color filter. The first color filter CF_D may further include a red color filter overlapping the first sub pixel R and a blue color filter overlapping the third sub pixel B, respectively.

The second color filter CF_S may be disposed in the opening portion of the second light blocking layer BM_S and may be in direct contact with the touch protection layer TPVX exposed by the opening portion of the second light blocking layer BM_S. For example, the second color filter CF_S may extend from an edge of the opening portion of the second light blocking layer BM_S to an upper surface of the second light blocking layer BM_S and may be in direct contact with the upper surface of the second light blocking layer BM_S. The second color filter CF_S may be disposed to overlap the optical sensor OPD.

The second color filter CF_S may be formed of a green or cyan color filter to block external light having a long wavelength incident on the optical sensor OPD. Therefore, a signal-to-noise ratio (SNR) of the optical sensor OPD may be increased.

The optical pattern layer OPL may be further disposed between the touch sensing layer TSL and the second color filter CF_S. The optical pattern layer OPL may be disposed in the opening portion of the second light blocking layer BM_S. For example, the optical pattern layer OPL may be disposed on the optical sensor OPD and overlap the optical sensor OPD.

The optical pattern layer OPL may serve to remove noise by distinguishing and selectively transmitting the light reflected from the ridge FR and valley FV of the finger F of the user. Therefore, a signal-to-noise ratio (SNR) of the fingerprint recognition signal may be improved. To this end, the optical pattern layer OPL may include a light blocking portion BA and a plurality of light transmitting portions TA passing provided between the light blocking portion BA. For example, the plurality of light transmitting portions TA may be openings between the light blocking portions BA. For example, the plurality of light transmitting portions TA may pass through the light blocking portion BA to expose a portion of the touch protection layer TPVX.

The light blocking portion BA may be disposed on the same layer as the light blocking layer BM described above. For example, the light blocking portion BA may be simultaneously formed with the light blocking layer BM. The light blocking portion BA may include the same material as the light blocking layer BM, or may include one or more materials selected from the materials used as an example for the configuration material of the light blocking layer BM. For example, the optical pattern layer OPL with a low modulus may be implemented by forming the light blocking portion BA using an organic light blocking material. Therefore, since the foldability of the display panel 10 may be increased, the foldable display device 1 may be easily implemented.

The plurality of light transmitting portions TA may serve to selectively transmit the second light L2 progressing to the optical sensor OPD, which is generated by the first light L1 emitted from the light emitting element layer EML and reflected from the finger F of the user.

The second color filter CF_S may fill the plurality of light transmitting portions TA. For example, the second color filter CF_S may be in direct contact with an inner sidewall of the light blocking portion BA. In addition, the second color filter CF_S may be in contact with one surface of the touch protection layer TPVX exposed by the light transmitting portion TA.

A planarization layer OC may be further disposed between the antireflection layer RFL and the cover window CW. The planarization layer OC may serve to planarize a step difference by the layers disposed under the planarization layer. The planarization layer OC may be an organic film. For example, the organic film may include an acrylic resin, an epoxy resin, a phenolic resin, a polyamide resin, and/or a polyimide resin, but the present invention is not limited thereto.

Figure 7:
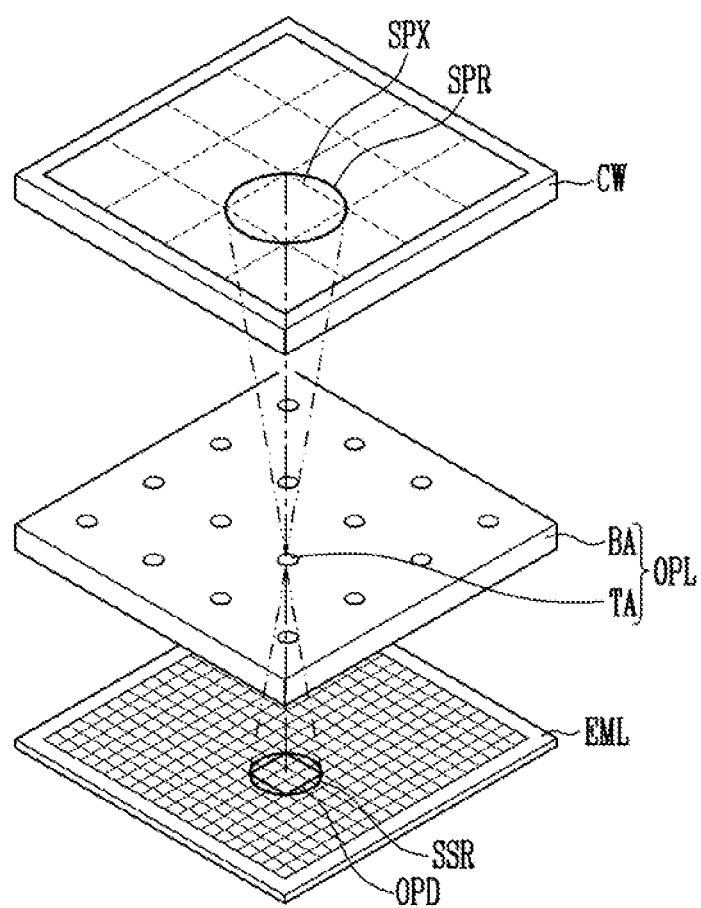
FIG. 7 is a perspective view illustrating a path of reflected light in the display device according to an embodiment of the present invention.
Figure 8:
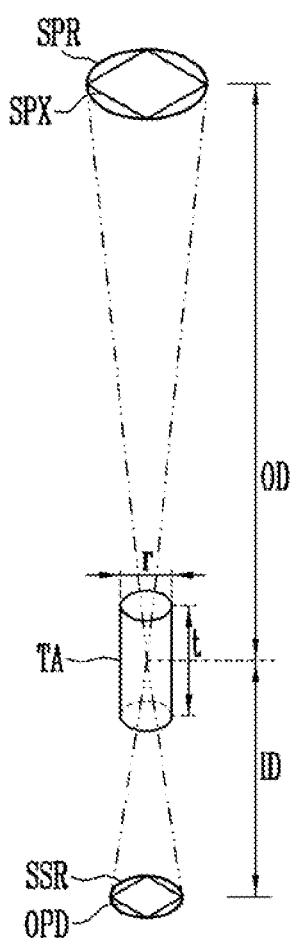
FIG. 8 is a diagram illustrating a fingerprint pixel and sensor pixels according to an embodiment of the present invention.

FIG. 7 is a perspective view illustrating a path of reflected light in the display device according to an embodiment of the present invention. FIG. 8 is a diagram illustrating a fingerprint pixel and a sensor pixel according to an embodiment of the present invention.

Referring to FIGS. 7 and 8, the cover window CW may include a plurality of sensor pixels SPX and a sampling region SPR surrounding each of the plurality of sensor pixels SPX. The light emitting layer EML may include a plurality of optical sensors OPD and a sensing region SSR surrounding each of the plurality of optical sensors OPD.

One sensor pixel SPX on the cover window CW may correspond to at least one optical sensor OPD of the light emitting layer EML. For example, one sensor pixel SPX may correspond to about 20 to about 30 optical sensors OPD, but the present invention is not limited thereto. The sampling region SPR on the cover window CW may correspond to the sensing region SSR of the fingerprint sensor layer FPSL.

Each of the plurality of sensor pixels SPX may correspond to one light transmitting portion TA of the optical pattern layer OPL. For example, when the finger F of the user contacts the cover window CW, each of the plurality of sampling regions SPR may reflect the first light L1 output from the display panel 10, and the second light L2 reflected from each of the plurality of sampling regions SPR may pass through the light transmitting portion TA of the optical pattern layer OPL and may be provided to the sensing region SSR of the light emitting layer EML.

The plurality of light transmitting portions TA of the optical pattern layer OPL may be a path of the second light L2 reflected by the finger F of the user so that the second light L2 can be received by the sensing region SSR. Therefore, the plurality of optical sensors OPD may sense the second light L2 reflected by the ridge FR of the finger F, that is in contact with the sampling region SPR on the cover window CW, and the valley FV between the ridges FR.

The display device 1 may sense the light reflected by the finger F of the user by means the optical sensor OPD according to a ratio of a fingerprint distance OD and a sensor distance ID. Here, the fingerprint distance OD may correspond to a distance between a surface of the cover window CW, on which the finger F of the user contacts and a center point of the light transmitting portion TA of the optical pattern layer OPL. The sensor distance ID may correspond to a distance between the center point of the light transmitting portion TA and the optical sensor OPD. For example, light reflected from one end (e.g., a first end) of the sensor pixel SPX on the cover window CW may pass through the center point of the light transmitting portion TA to reach another end (e.g., a second end) of the optical sensor OPD.

In addition, light reflected from another end (e.g., a second end opposite the first end) of the sensor pixel SPX on the cover window CW may pass through the center point of the light transmitting portion TA to reach the one end (e.g., a first end opposite the second end) of the optical sensor OPD. Therefore, a shape of the fingerprint directly contacting the sensor pixel SPX and an image formed on the optical sensor OPD may have a difference of about 180 degrees.

The light transmitting portion TA may be formed to have a high aspect ratio to distinguish the light reflected from the ridge FR of the finger F of the user and the light reflected from the valley FV, and to provide the light reflected from the ridge FR and the light reflected from the valley FV to a separate optical sensor OPD. For example, the aspect ratio of the light transmitting portion TA represented by Equation 1 may have a value equal to or greater than 2.

Aspect ratio of light transmitting portion $(TA)$=height $(t)$ of light transmitting portion $TA$/line width $(r)$ of light transmitting portion $TA$ (e.g., aspect ratio of light transmitting portion $TA=(t)/(r)$). [Equation 1]

Here, the line width r of the light transmitting portion TA may be a length, in the first direction (X-axis direction) or the second direction (Y-axis direction), of the light transmitting portion TA.

Figure 9:
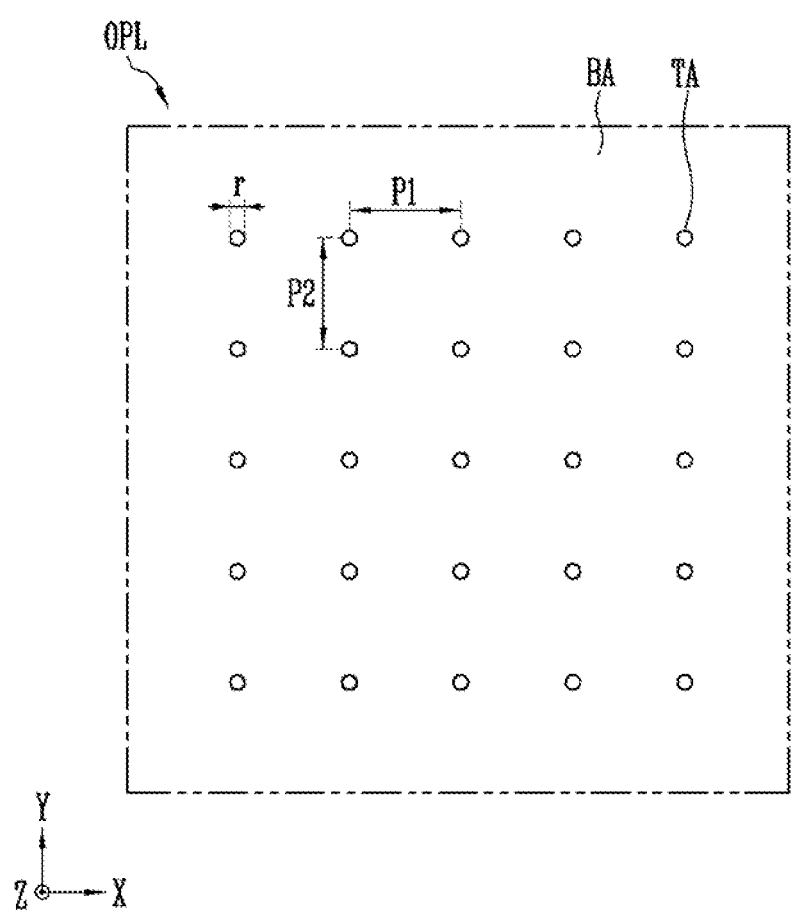
FIG. 9 is a plan view illustrating an example of an optical pattern layer of the display device according to an embodiment of the present invention.

FIG. 9 is a plan view illustrating an example of the optical pattern layer of the display device according to an embodiment of the present invention.

Referring to FIG. 9, the optical pattern layer OPL may include the plurality of light transmitting portions TA. For example, a planar shape of the plurality of light transmitting portions TA may be circular. The line width (or, e.g., diameter) r of each of the light transmitting portions TA may be about 3 to about 20 μm, but the present invention is not limited thereto.

The plurality of light transmitting portions TA may be arranged to have a first pitch P1 in the first direction (X-axis direction). For example, the first pitch P1 may be about 1.3 to about 1.5 times the sensor distance ID, and preferably about 1.3 times the sensor distance ID.

The plurality of light transmitting portions TA may be arranged to have a second pitch P2 in the second direction (Y-axis direction). For example, the second pitch P2 may be substantially the same as the first pitch P1. As another example, the second pitch P2 may be different from the first pitch P1.

For example, the plurality of light transmitting portions TA may be arranged side by side along the first direction (X-axis direction) and the second direction (Y-axis direction). As another example, the plurality of light transmitting portions TA may be arranged along the first pitch P1 and the second pitch P2, and may be aligned in a direction except for the first direction (X-axis direction) and the second direction (Y-axis direction). For example, the plurality of light transmitting portions TA may be arranged with a zig-zag arrangement or a staggered arrangement.

For example, the first pitch P1 or the second pitch P2 may be proportional to a thickness of the thin film encapsulation layer TFEL. When the thickness of the thin film encapsulation layer TFEL increases, the fingerprint distance OD may increase, and the area of the sensor pixel SPX and the sampling region SPR may also increase. Therefore, the first pitch P1 or the second pitch P2 of the plurality of light transmitting portions TA may be proportional to the thickness of the thin film encapsulation layer TFEL to adjust the ratio of the fingerprint distance OD and the sensor distance ID.

For example, the first pitch P1 or the second pitch P2 may be proportional to a distance between the light emitting elements of the light emitting element layer EML or a distance between the sub pixels SP. As the distance between the light emitting elements increases, a distance between the second light L2 reflected by the finger F may also increase. Therefore, the first pitch P1 or the second pitch P2 may be proportional to the distance between the light emitting elements or the sub pixels SP so that the plurality of light transmitting portions TA act as the path of the second light L2.

Figure 10:
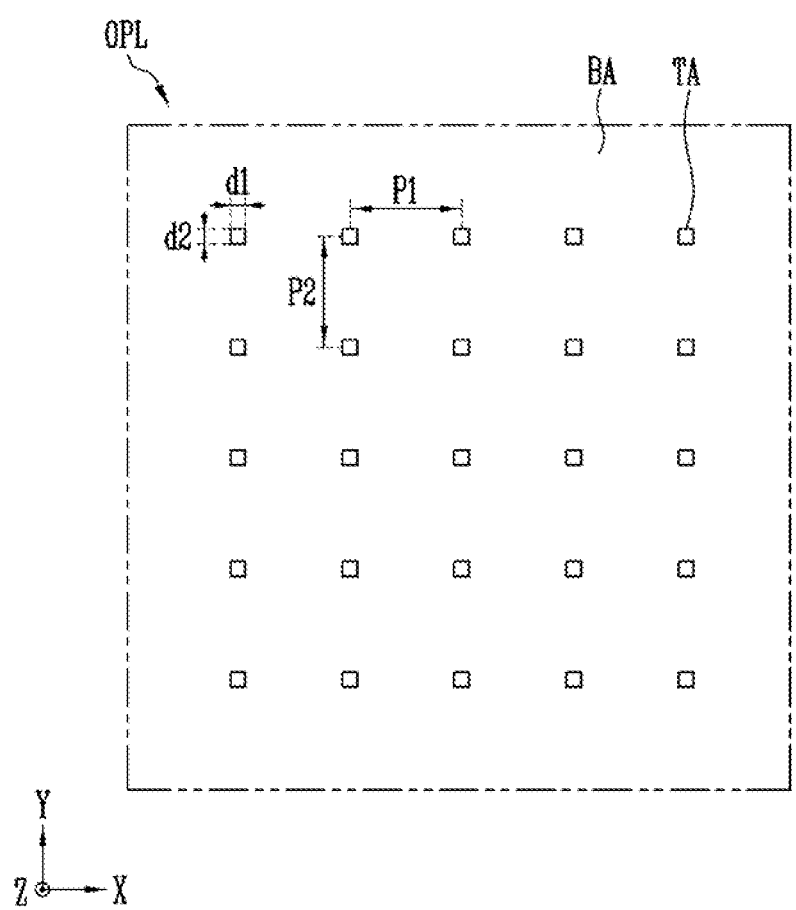
FIG. 10 is a plan view illustrating an example of the optical pattern layer of the display device according to an embodiment of the present invention.

FIG. 10 is a plan view illustrating an example of the optical pattern layer of the display device according to an embodiment of the present invention. The light transmitting portion TA of FIG. 10 has a shape different from that of the light transmitting portion TA of FIG. 9, and substantially the same configuration as the above-described configuration will be briefly described or omitted.

Referring to FIG. 10, the planar shape of the plurality of light transmitting portions TA may be a quadrangular shape. Each of the plurality of light transmitting portions TA may have a first length d1 in the first direction (X-axis direction) and may have a second length d2 in the second direction (Y-axis direction). For example, the first length d1 of each of the plurality of light transmitting portions TA may be about 3 to about 20 μm, but the present invention is not limited thereto. For example, the second length d2 of each of the plurality of light transmitting portions TA may be the same as the first length d1. As another example, the second length d2 of each of the plurality of light transmitting portions TA may be different from the first length d1.

In addition, the shape of the plurality of light transmitting portions TA is not limited to a circular shape and a quadrangular shape shown in FIGS. 9 and 10. For example, the plurality of light transmitting portions TA may be formed in various shapes such as an ellipse and a polygon. In addition, the plurality of light transmitting portions TA may have different shapes from each other in the optical pattern layer OPL.

According to the above-described embodiment, the thickness of the display panel 10 may be minimized by disposing the light emitting element OLED and the optical sensor OPD on the same layer.

In addition, the signal-to-noise ratio (SNR) of the fingerprint recognition signal may be increased and the folding characteristic of the display device 1 may be improved, by implementing the optical pattern layer OPL with the low modulus. For example, the foldable display device may be easily implemented.

Hereinafter, an exemplary embodiment of the present invention will be described. In the following exemplary embodiment of the present invention, the same configurations as those that are already described will be denoted by the same reference numerals, and repetitive descriptions may be omitted or simplified.

FIG. 11 is a cross-sectional view of the display device according to an embodiment of the present invention.

The display device 1_1 of FIG. 11 is different from the display device 1 of FIGS. 1 to 10 in that the optical pattern layer OPL is disposed on the second color filter CF_S.

Referring to FIG. 11, the optical pattern layer OPL may be disposed between the second color filter CF_S and the planarization layer OC.

The optical pattern layer OPL may include the light blocking portion BA and the light transmitting portion TA passing through the light blocking portion BA. For example, the light transmitting portion TA may be provided between adjacent light blocking portions BA. For example, the light transmitting portion TA may pass through the light blocking portion BA to expose a portion of the second color filter CF_S.

The planarization layer OC may fill the plurality of light transmitting portions TA. For example, the planarization layer OC may be in contact with the inner sidewall of the light blocking portion BA. For example, the planarization layer OC may be in direct contact with the light blocking portion BA. In addition, the planarization layer OC may be in contact with one surface of the second color filter CF_S exposed by the light transmitting portion TA.

Since other configurations have been described with reference to FIG. 5, repetitive descriptions may be omitted.

According to the present embodiment, the thickness of the display panel 10 may be minimized by disposing the light emitting element OLED and the optical sensor OPD on the same layer. In addition, as described above, the folding characteristic of the display device 1_1 may be improved and the signal-to-noise ratio (SNR) of the optical sensor OPD may be increased, by implementing the optical pattern layer OPL of the low modulus.

FIG. 12 is a cross-sectional view of the display device according to an embodiment of the present invention.

The display device 1_2 of FIG. 12 is different from the display device 1 of FIGS. 1 to 10 in that the display device 1_2 further includes a plurality of first transmission patterns TP_D and second transmission patterns TP_S.

Referring to FIG. 12, the plurality of first transmission patterns TP_D may be disposed on the light emitting element OLED to overlap the light emitting element OLED. A white angular dependency (WAD) of the display device 1_2 may be reduced by disposing the first transmission pattern TP_D on the light emitting element OLED. Here, the WAD refers to an issue such that a green (or another color) hue is recognized at an edge according to a viewing angle of an observer.

The plurality of first transmission patterns TP_D may be disposed between the touch sensing layer TSL and the first color filter CF_D. The plurality of first transmission patterns TP_D may be disposed in the opening portion of the first light blocking layer BM_D.

The plurality of first transmission patterns TP_D may be arranged with a predetermined interval in the first direction (X-axis direction) or the second direction (Y-axis direction).

The plurality of first transmission patterns TP_D may be formed of an inorganic film or an organic film. For example, the inorganic film may be a silicon nitride (SiNx) layer, a silicon oxynitride (SiON) layer, a silicon oxide (SiOx) layer, a titanium oxide (TiOx) layer, and/or an aluminum oxide (AlOx) layer, but the present invention is not limited thereto. For example, the organic film may be an acrylic resin, an epoxy resin, a phenolic resin, a polyamide (PA) resin, and/or a polyimide (PI) resin, but present invention is not limited thereto.

For example, an upper surface and a side surface of the plurality of first transmission patterns TP_D may be in direct contact with the first color filter CF_D.

An optical pattern layer OPL' may include a plurality of second transmission patterns TP_S disposed between the plurality of light blocking portions BA.

The plurality of second transmission patterns TP_S may serve to selectively transmit the second light L2 progressing to the optical sensor OPD, which is generated by the first light L1 emitted from the light emitting element layer EML and reflected from the finger F of the user.

For example, the plurality of second transmission patterns TP_S may be in direct contact with the inner sidewall of the light blocking portion BA.

The plurality of second transmission patterns TP_S may pass through the light blocking portion BA and may be disposed on the touch protection layer TPVX. For example, the plurality of second transmission patterns TP_S may contact a portion of one surface of the touch protection layer TPVX.

The plurality of second transmission patterns TP_S may include the same material as the above-described first transmission pattern TP_D or may include one or more materials selected from the materials used as an example for the configuration material of the first transmission pattern TP_D. The plurality of first transmission patterns TP_D and the second transmission patterns TP_S may be simultaneously formed.

Since other configurations have been described with reference to FIG. 5, repetitive descriptions may be omitted.

According to the present embodiment, the thickness of the display panel may be minimized by disposing the light emitting element OLED and the optical sensor OPD on the same layer. In addition, the folding characteristic of the display device 1_2 may be improved and the signal-to-noise ratio (SNR) of the optical sensor OPD may be improved, by implementing the optical pattern layer OPL' of a low modulus.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A display device comprising:
a substrate;
a first display pixel disposed on the substrate and including a light emitting element;
a first sensor pixel disposed on the substrate and including an optical sensor;
a first bank disposed on the substrate, wherein the first display pixel is disposed in the first bank;
a first light blocking layer overlapping the first bank;
a first color filter disposed on the first light blocking layer and overlapping the light emitting element; and
an optical pattern layer disposed on the optical sensor, wherein the optical pattern layer includes a light blocking portion and a plurality of light transmitting portions passing through the light blocking portion, wherein the light emitting element includes a first pixel electrode and a light emitting layer disposed on the first pixel electrode,
the optical sensor includes a second pixel electrode and a light receiving layer disposed on the second pixel electrode, and
the first pixel electrode and the second pixel electrode are formed from the same conductive layer.

2. The display device according to claim 1, further comprising:
a common electrode disposed on the light receiving layer and the light emitting layer.

3. The display device according to claim 2, further comprising:
a first source electrode and a first drain electrode, wherein the first source electrode or the first drain electrode is electrically connected to the first pixel electrode; and a second source electrode and a second drain electrode, wherein the second source electrode or the second drain electrode is electrically connected to the second pixel electrode, wherein the first source electrode, the first drain electrode, the second source electrode, and the second drain electrode are formed from the same conductive layer.

4. The display device according to claim 1, wherein the light blocking portion and the first light blocking layer are formed of the same material.

5. The display device according to claim 1, further comprising:
a second bank disposed on the substrate, wherein the first sensor pixel is disposed in the second bank,
wherein the first bank and the second bank are formed of the same material.

6. The display device according to claim 5, further comprising:
a second light blocking layer overlapping the second bank,
wherein the first light blocking layer and the second light blocking layer are formed of the same material.

7. The display device according to claim 1, further comprising:
a thin film encapsulation layer disposed on the light emitting element and the optical sensor;
a cover window disposed on the thin film encapsulation layer; and
a touch sensing layer disposed between the thin film encapsulation layer and the cover window.

8. The display device according to claim 1, wherein the substrate comprises:
a folding area;
a first non-folding area positioned at one side of the folding area; and
a second non-folding area positioned at another side of the folding area.

9. The display device according to claim 1, wherein the optical sensor includes a photo transistor or a photo diode.

10. The display device according to claim 1, further comprising:
a second color filter disposed between the optical sensor and the optical pattern layer.

11. The display device according to claim 10, further comprising:
a planarization layer disposed on the optical pattern layer, wherein the planarization layer is disposed on an inner wall of the light blocking portion through the plurality of light transmitting portions.

12. The display device according to claim 11, wherein the planarization layer is in contact with the second color filter through the plurality of light transmitting portions.

13. A display device comprising:
a substrate;
a first display pixel disposed on the substrate and including a light emitting element;
a first sensor pixel disposed on the substrate and including an optical sensor;
a first bank disposed on the substrate, wherein the first display pixel is disposed in the first bank;
a first light blocking layer overlapping the first bank;
a first color filter disposed on the first light blocking layer and overlapping the light emitting element; and
an optical pattern layer disposed on the optical sensor,
wherein the optical pattern layer includes a light blocking portion and a plurality of light transmitting portions passing through the light blocking portion, wherein the display device further comprises a second color filter disposed on the optical pattern layer and overlapping the optical sensor.

14. The display device according to claim 13, wherein the second color filter is disposed on an inner wall of the light blocking portion through the plurality of light transmitting portions.

15. The display device according to claim 13, further comprising:
a planarization layer covering the first color filter and the second color filter.

16. The display device according to claim 13, further comprising:
a plurality of first transmission patterns disposed on the light emitting element.

17. The display device according to claim 16, wherein the first color filter is disposed on an upper surface and a side surface of the first transmission pattern.

18. The display device according to claim 16, further comprising:
a second transmission pattern disposed in the plurality of light transmitting portions of the optical pattern layer,
wherein the second transmission pattern is formed of the same material as the first transmission pattern.

19. The display device according to claim 18, wherein the second color filter is disposed on the second transmission pattern and an upper surface of the light blocking portion.

* * * * *